United States Patent
Benwadih

(10) Patent No.: US 8,987,724 B2
(45) Date of Patent: Mar. 24, 2015

(54) ORGANIC PHOTODIODE PROVIDED WITH AN ACTIVE ZONE COMPRISING MEANS FOR PROMOTING CHARGE CARRIER COLLECTION AND CONDUCTION

(75) Inventor: Mohammed Benwadih, Champigny sur Marne (FR)

(73) Assignees: Commissariat à l'énergie atomique et aux énergies alternatives, Paris (FR); ISORG, Grenoble (FR)

( * ) Notice: Subject to any disclaimer, the term of this patent is extended or adjusted under 35 U.S.C. 154(b) by 0 days.

(21) Appl. No.: 14/126,981

(22) PCT Filed: Jun. 19, 2012

(86) PCT No.: PCT/EP2012/061740
§ 371 (c)(1),
(2), (4) Date: Dec. 17, 2013

(87) PCT Pub. No.: WO2012/175512
PCT Pub. Date: Dec. 27, 2012

(65) Prior Publication Data
US 2014/0110695 A1 Apr. 24, 2014

(30) Foreign Application Priority Data
Jun. 22, 2011 (FR) ...................................... 11 55509

(51) Int. Cl.
*H01L 29/08* (2006.01)
*H01L 33/00* (2010.01)
(Continued)

(52) U.S. Cl.
CPC .......... *H01L 51/441* (2013.01); *H01L 51/4253* (2013.01); *B82Y 10/00* (2013.01); *H01L 51/0036* (2013.01); *H01L 51/0047* (2013.01); *Y02E 10/549* (2013.01)
USPC .................. 257/40; 257/98; 257/186; 438/94

(58) Field of Classification Search
CPC .............. H01L 51/441; H01L 51/4523; H01L 51/0036; H01L 51/0047; Y02E 10/549
USPC ........ 257/40, E21.09, E25.032, 186, 461, 98; 438/94, 82, 69, 99
See application file for complete search history.

(56) References Cited

U.S. PATENT DOCUMENTS

2002/0192441 A1* 12/2002 Kalkan et al. ................. 428/209
2004/0118448 A1* 6/2004 Scher et al. ................... 136/252
(Continued)

FOREIGN PATENT DOCUMENTS

| | | |
|---|---|---|
| EP | 2 037 529 A1 | 3/2009 |
| JP | 2003-197283 A | 7/2003 |
| WO | 2010 036805 | 4/2010 |

OTHER PUBLICATIONS

French Search Report issued Feb. 10, 2012 in Patent Application No. 1155509 with English translation of categories of cited documents.
(Continued)

*Primary Examiner* — Long K Tran
*Assistant Examiner* — Dzung Tran
(74) *Attorney, Agent, or Firm* — Oblon, McClelland, Maier & Neustadt, L.L.P.

(57) ABSTRACT

A photodiode including at least one active zone located between a first electrode and a second electrode, the active zone including elongated conducting or semiconducting elements extending between the electrodes and configured to promote collection and transport of charge carriers in the active zone.

19 Claims, 3 Drawing Sheets

(51) Int. Cl.
*H01L 31/107* (2006.01)
*H01L 21/00* (2006.01)
*H01L 51/44* (2006.01)
*H01L 51/42* (2006.01)
*B82Y 10/00* (2011.01)
*H01L 51/00* (2006.01)

(56) References Cited

U.S. PATENT DOCUMENTS

| | | | |
|---|---|---|---|
| 2004/0250848 A1* | 12/2004 | Sager et al. | 136/252 |
| 2006/0289057 A1* | 12/2006 | Gonda et al. | 136/263 |
| 2008/0012005 A1 | 1/2008 | Yang et al. | |
| 2008/0092953 A1* | 4/2008 | Lee | 136/261 |
| 2008/0176030 A1 | 7/2008 | Fonash et al. | |
| 2010/0041177 A1 | 2/2010 | Yang et al. | |
| 2010/0089443 A1 | 4/2010 | Bloomstein et al. | |

OTHER PUBLICATIONS

Afshin Hadipour, et al., "Organic Tandem and Mutli-Junction Solar Cells", Advanced Functional Materials, vol. 18, 2008, pp. 169-181.

P. Vanlaeke, et al., "P3HT/PCBM bulk heterojunction solar cells: Relation between morphology and electro-optical characteristics", Solar Energy Materials and Solar Cells, vol. 90, 2006, pp. 2150-2158.

Steven K. Hau, et al., "Air-stable inverted flexible polymer solar cells using zinc oxide nanoparticles as an electron selective layer", Applied Physics Letters, vol. 92, 253301, 2008, pp. 1-3.

Taichiro Morimune, et al., "High Speed organic Photodectectors using Heterostructure with Phthalocyanine and Perylene Derivative" Japanese Journal of Applied Physics, vol. 45, No. 1B, 2006, pp. 546-549.

A.M. Nardes, et al., "Conductivity, work function, and environmental stability of PEDOT:PSS thin films treated with sorbitol", Organic Electronics, vol. 9, 2008, pp. 727-734.

Xin Xu, et al., "Organic photodetector arrays with indium tin oxide electrodes patterned using directly transferred metal masks", Applied Physics letters, vol. 94, 043313, 2009, pp. 1-3.

Jiangeng Xue, et al., "Carrier transport in multilayer organic photodetectors: I. Effects of layer structure on dark current and photoresponse", Journal of Applied Physics, vol. 95, No. 4, Feb. 15, 2004, pp. 1859-1868.

International Search Report Issued Sep. 19, 2012 in PCT/EP12/061740 Filed Jun. 19, 2012.

* cited by examiner

ORGANIC PHOTODIODE PROVIDED WITH AN ACTIVE ZONE COMPRISING MEANS FOR PROMOTING CHARGE CARRIER COLLECTION AND CONDUCTION

TECHNICAL FIELD

This application relates to the field of photodiodes provided with an active zone for conversion of photons into excitons, particularly based on one or more semiconducting polymer materials, and includes a new photodiode structure with an active zone in which collection and transport of charge carriers are improved, and a method for making such a structure.

STATE OF PRIOR ART

In image sensors, photodiodes are components designed to convert quantities of photons representative of brightness levels into proportional electrical magnitudes.

This conversion is made in a zone 2 of the photodiode, usually called the "active" zone and that is located between two electrodes 4 and 6.

The active zone 2 may be a junction between two regions, a first region 3 based on a first N type semiconducting material that is an electron donor and a second region 5 based on a second P type material that is an electron acceptor (FIG. 1A).

There are photodiodes for which the active zone is formed from one or more semiconducting materials, the active zone of which is formed from one or more polymer semiconducting materials.

In particular, it is known that these photodiodes can be made by forming active zones 2 based on a mix of polymers comprising at least one electron acceptor polymer and at least one electron donor polymer.

An interaction of photons with such a material can form excitons, in other words pairs of electron holes, which separate to form an electric current.

An example of an organic photodiode according to prior art is given in FIG. 1B. The photodiode is formed on a substrate 10 covered with an anode 12, for example based on ITO (Indium Tin Oxide) and PEDOT:PSS, the anode being covered by an active layer 12 formed from a mix of polymer materials comprising a donor polymer and an acceptor polymer material, the active layer 12 itself being covered by a cathode 16.

With such an active layer material, the life of excitons and the mobility of charge carriers are low. Thus, only a small proportion of electron-hole pairs generated by photons effectively contribute to creating a photo-current.

The efficiency EQE (External Quantum Efficiency) at which photon electrons are converted is a means of quantifying performances of the material in the active layer 12.

The problem arises of implementing a photodiode with an active zone based on polymer material with an improved EQE efficiency.

PRESENTATION OF THE INVENTION

The invention relates firstly to a component and particularly a diode provided with electrodes, and at least one active zone between these electrodes formed from at least one given semiconducting material, the active zone also comprising one or several elements in the given semiconducting material between the electrodes and based on a conducting or semiconducting material different from said given material.

The conducting or semiconducting elements are formed from elongated zones that extend between electrodes in the given material of the active zone along a direction at a non-zero angle from the electrodes.

The diode may be a photodiode, particularly organic, the active zone of which will generate excitons after absorption of photons.

Among said elements, there may be one or several first elements based on a material promoting conduction of holes.

Said elements may also include one or several second elements based on a material promoting conduction of electrons.

The conducting or semiconducting elements located in the material of the active zone of the diode can improve the efficiency of photon-electron conversion and the collection of charges by electrodes.

With such elements, the collection of charges in the active zone can thus be improved.

In particular, these elements may extend along a direction orthogonal to the electrodes.

Preferably the conducting or semiconducting elements are arranged to not be in contact with the electrodes.

The conducting or semiconducting elements may be in the form of bars or elongated or oblong tracks.

With such elements, drainage of charges may be improved, particularly for devices with a large distance between electrodes, for example of the order of several millimetres.

With such elements, drainage of charges is improved particularly in active zones based on an organic or polymer semiconducting material.

The conducting or semiconducting elements are thus based on a material different from the material used in the regions of the active zone with which these elements are in contact, the material of the conducting elements promoting transport of charges in the active zone.

The conducting or semiconducting elements may thus be designed so as to have better conductivity than the conductivity of the material in the active zone, particularly with a conductivity at least twice as high as the conductivity of the material in the active zone.

According to one particular arrangement, the conducting or semiconducting elements may be formed from a set of tracks arranged in an alternating pattern of tracks promoting conduction of holes and of tracks promoting conduction of electrons.

The area of the junction is thus increased using a donor/acceptor network for the transport of holes to the anode and electrons to the cathode.

According to one possible embodiment, the tracks promoting conduction of holes and the tracks promoting conduction of electrons are arranged in the form of interdigitated combs.

With such an arrangement, the collection and conduction of carriers to electrodes is further improved, while limiting the dimensions.

The first electrode may act as an anode while the second electrode will act as a cathode. In this case, the first element(s) promoting conduction of holes may be located closer to the anode than to the cathode, to improve collection of holes.

According to one possible embodiment, the element(s) promoting conduction of holes may be at a distance $d_1$ from the anode and at a distance $\Delta_1$ from the cathode, in which $d_1/\Delta_1 \leq 10$.

Elements promoting conduction of electrons may be placed closer to the cathode than to the anode, to be promoting collection of electrons.

According to one possible embodiment, the second element(s) promoting conduction of electrons may be located at a distance $d_2$ from the cathode and a distance $\Delta_2$ from the anode, such that $d_2/\Delta_2 \leq 10$.

According to one possible embodiment, the total external area of said conducting or semiconducting elements that can be exposed to light radiation, may be designed to be 10 times smaller than the external area of the active zone exposed to this radiation.

This thus limits parasite reflection phenomena.

The thickness of the elements exposed to light radiation may be selected to be less than or equal to 100 nanometres and advantageously less than or equal to 20 nanometres.

This also limits parasite reflection phenomena.

According to one possible embodiment, said elements may be based on an ambipolar material.

According to one possible embodiment, said elements may be based on an ambipolar or semiconducting material selected so that the mobility of charge carriers in this material is higher than, particularly twice as high as, the mobility of charge carriers in the material in the active zone in which said elements are located.

The given material may be a semiconducting polymer material.

According to another possible embodiment, said elements may be based on a polymer conducting material.

According to another possible embodiment, said elements may be based on a metal covered with a layer capable of modifying the work function of said metal, such as a SAM (self assembled monolayer) layer.

According to one possible embodiment of the diode, said elements may include one or several first element(s) based on a P type conducting material chosen from among Au, ITO, Cu, Ni, Ag, Pd, PEDOT:PSS.

According to one possible embodiment of the diode, said element(s) may include one or several second elements based on an N type conducting material chosen from among the following materials Ca, Al.

According to one possible embodiment of the diode, said elements may also include:
 one or several element(s) based on a metal covered by a P type SAM layer such as a PFBT or pentafluorobenzenethiol layer,
 and/or,
 one or several first element(s) based on a metal covered with an N type SAM layer such as a 4MTP or methoxythiolphenol layer.

According to one possible embodiment of the active zone, this zone may be formed from a first region based on said first polymer material and a second region adjacent to the first region and based on said second polymer material, at least one of said elements being based on a metal zone passing through the first region and the second region, the metal zone being covered in said first region by a layer capable of increasing the work function of said metal, the metal zone being also covered in said second region with a layer capable of reducing the work function of said metal.

According to one possible embodiment, the active zone of the component is formed from a mix of a first polymer semiconducting material donor of electrons and a second polymer semiconductor material acceptor of electrons.

The active zone of the component may possibly be formed from a mix of a polymer semiconductor material and an organic semiconductor material.

According to one particular embodiment of the diode, the active zone may advantageously be formed from a mix of PCBM and P3HT, while said elements include first elements based on Au covered with a P3HT-based SAM layer, and second Au-based elements covered with a layer of 4 MTP.

According to one aspect of this particular embodiment, the total external area of the elements that may be exposed to light radiation may be of the order of 20% of the external area of the active zone exposed to this radiation.

This invention also includes a microelectronic device comprising at least one diode like that defined above in which said conducting elements are connected to an external load. This external load may be in the form of at least one capacitor or means forming an accumulator, that is recharged through a current generated by the diode and circulating in said conducting or semiconducting elements.

BRIEF DESCRIPTION OF THE DRAWINGS

This invention will be better understood after reading the description of example embodiments given purely for guidance and in no way limitative, with reference to appended drawings in which.

Figure 1A:
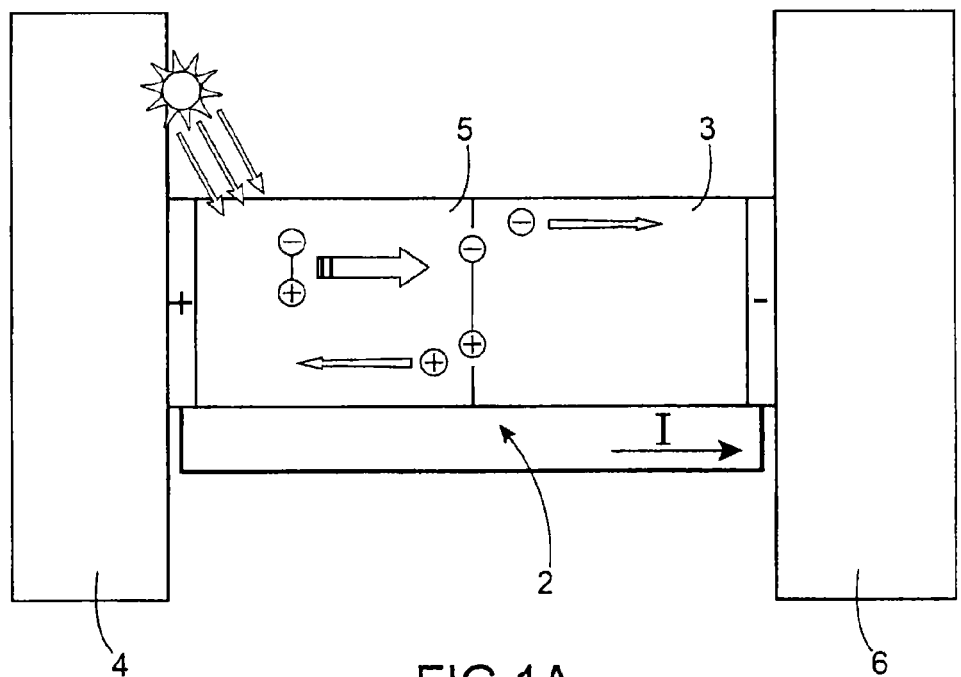
FIGS. 1A, 1B show a photodiode device according to prior art.
Figure 1B:
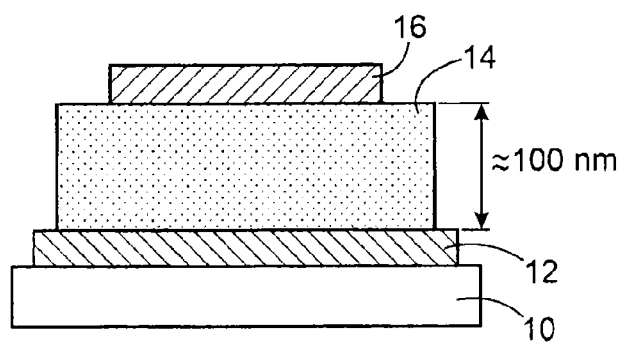

Identical, similar or equivalent parts of the different figures have the same numeric references to facilitate comparisons between one figure and another.

The different parts shown in the figures are not necessarily all at the same scale, to make the figures more easily legible.

DETAILED PRESENTATION OF PARTICULAR EMBODIMENTS

An example diode according to the invention will now be described with reference to FIGS. 2A-2B and 3.

This diode may be a photodiode comprising a zone 102 called the "active zone" for conversion of photons into excitons located between electrodes 104 and 106, a first electrode 104 being designed to act as anode, and the second electrode 106 being designed to act as cathode.

For example, the cathode 106 may be based on Al, or Au, or an alloy of Au and Ti, or Indium, or an alloy based on calcium and silver, or a compound of 2,9-dimethyl-4,7-diphenyl-1, 10-phenanthroline commonly called BCP and silver.

For example, the anode 104 may be based on Mn, or Cr, or Ar, or Indium, or a calcium silver alloy, or a gold and platinum alloy, or ITO (Indium Tin Oxide).

The active zone 102 is formed from at least one semiconducting material 103 and it may comprise at least one semiconducting polymer.

Figure 2A:
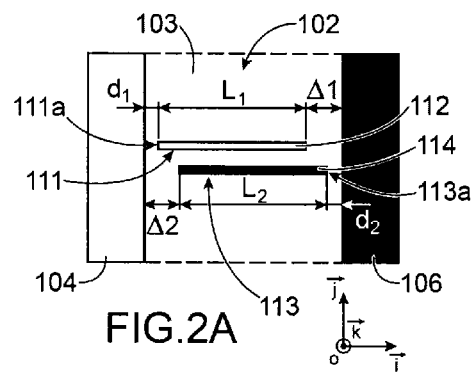
FIGS. 2A-2B show an example photodiode according to the invention, with an active zone based on polymers and in which elements are promoting collection and transport of charge carriers in this active zone.

According to one possible embodiment, the material 103 in the active zone 102 may be formed from a mix of polymers comprising at least one electron acceptor polymer and at least one electron donor polymer (FIG. 2A).

According to another possible embodiment (FIG. 2B), the material 103 may be formed from a first region 102a formed from at least one electron acceptor polymer, and a second region 102b adjacent to the first region 102a and that is based on at least one electron donor polymer.

The polymer material 103 may be a mix of a P type polymer for example such as poly(3-hexylthiophene) or poly(3-hexylthiophene-2,5-diyl) and commonly called "P3HT", and an N type polymer. The N type material may for example be methyl[6,6]-phenyl-$C_{61}$-butanoate commonly called "PCBM" on which a polymer may be grafted.

Conducting or semiconducting elements 111, 113 are provided in the material 103 of the active zone 102 between the electrodes 104 and 106, to improve collection and circulation of charge carriers.

The elements 111, 113 are designed particularly with a material to improve transport of charge carriers in the active zone and to be supplied to their corresponding electrodes 104, 106.

These elements 111, 113 extend in the material 103 of the active zone 102 and may be in the form of elongated or oblong shaped tracks or bars. The collection of charge carriers in the active zone to be supplied to their corresponding electrodes 104, 106 is thus also improved.

A first element 111 based on a first material 112 promoting conduction of holes passes through part of the active zone 102 and extends along the direction of its length $L_1$ (defined as the direction parallel to the vector $\vec{i}$ of the orthogonal coordinate system $[O; \vec{i}; \vec{j}; \vec{k}]$ given in FIG. 2A) between electrodes 104 and 106. The first element 111 enables faster and more efficient collection of holes than an active zone based on material 103 alone and applied according to prior art.

A second element 113 based on a second material 114 promoting conduction of electrons passes through part of the active zone 102 and extends along the direction of its length $L_2$ (defined along a direction parallel to the vector $\vec{i}$ of the orthogonal coordinate system $[O; \vec{i}; \vec{j}; \vec{k}]$ given in FIG. 2A) between electrodes 104 and 106. The second element 113 enables faster and more efficient collection of electrons than an active zone based on material 103 alone and applied according to prior art.

The first element 111 and the second element 113 may be in the form of elongated zones or tracks or rods, with corresponding lengths $L_1$ and $L_2$ equal to between 10 nanometres and 100 micrometres.

In the example in FIG. 2A, the first element 111 and the second element 113 extend along a direction forming a non-zero angle, particularly 90°, with electrodes 104 and 106.

The first element 111 comprises an end 111a or a zone located close to the anode 104 and for example at a spacing from the anode equal to a distance $d_1$ (defined along a direction parallel to the vector $\vec{i}$ of the orthogonal coordinate system $[O; \vec{i}; \vec{j}; \vec{k}]$) that may for example be between several nanometres and 10 micrometers.

The first element 111 promoting conduction of holes is arranged so that it is further from the cathode 106 than it is from the anode 104. The first element 111 may be further from the cathode 104 by a distance $\Delta_1$ for example between 1 micrometer and 100 micrometers.

According to one possible embodiment, the distance of the first element 111 from the cathode 104 may be equal to $\Delta_1$ and at least ten times the distance $d_1$, for example $d_1$ being equal to 1 μm and $\Delta_1$ being equal to 10 μm, or $d_1$ equal to 2 μm and $\Delta_1$ equal to 20 μm.

The second element 113 comprises an end or a zone located close to the cathode 106 and for example at a distance from the cathode 106 equal to $d_2$ (defined along a direction parallel to the vector $\vec{i}$ of the orthogonal coordinate system $[O; \vec{i}; \vec{j}; \vec{k}]$) that may for example be between several nanometres and 10 micrometers. The second element 113 promoting conduction of electrons is arranged further from the anode 104 than from the cathode 106. The second element 113 may be located at a distance $\Delta_2$ from the anode 104 for example between 1 micrometer and 100 micrometers.

According to one possible embodiment, the second element 113 may be at a distance $\Delta_2$ from the anode 104 equal to at least 10 times $d_2$, where $d_2$ is for example equal to 1 μm and $\Delta_2$ is equal to 10 μm, or $d_2$ is equal to 2 μm while $\Delta_2$ is equal to 20 μm.

The first element 111 is in contact with neither the electrode 104 nor the electrode 106. Similarly, the second element 113 is not in contact with any of the electrodes 104, 106.

In order to minimise reflection phenomena, the first element 111 and the second element 113 may be chosen to be thin for the passage of light radiation that can penetrate into the active zone, less than or equal to 100 nanometres and advantageously less than or equal to 20 nanometres. In this example, the thickness is not the same dimension as the dimension $L_1$ and is measured along a direction orthogonal to the vector $\vec{i}$, when radiation is expected to penetrate through a face of the active zone 102 parallel to the plane $[O; \vec{i}; \vec{k}]$, and/or when radiation is expected to penetrate through a face of the active zone 102 parallel to the plane $[O; \vec{j}; \vec{k}]$).

To minimise reflection phenomena, the first element 111 and the second element 113 may also be designed such that the area that can be exposed to light radiation will be at least 10 times less than the area of the active zone that can be exposed to this light radiation.

The material 112 promoting conduction of holes can be chosen so that its conductivity $\sigma_1$ is higher than the conductivity $\sigma'$ of holes of the material(s) 103 in the active zone. The conductivity $\sigma_1$ of the material 112 may advantageously be such that $\sigma_1 \geq 2*\sigma'$.

According to one possible embodiment, the material 112 promoting conduction of holes may be a P type semiconducting material, for example such as 6,13-bis(triisopropylsilyl-ethynyl) TIPS pentacene, chosen such that the mobility $\mu_1$ of holes in this material 112 is at least twice as high as the mobility of holes in the material 103 in the remainder of the active zone 102.

The material 112 promoting conduction of holes may for example be based on a metallic material such as Au, Ni, Pt or ITO (Indium Tin Oxide), or indium oxide doped with tin) or a P type semiconductor as for example P doped Si.

The material 112 may also be an ambipolar material such as N and P doped Si.

The material 112 may also be a metal for example such as Au covered with an SAM (self assembled monolayer) layer, designed to increase the work function of said metal for holes, and that may be based on a polymer such as PFBT or pentafluorobenzenethiol.

The material 112 may also be an electron donor polymer such as PEDOT poly(3,4-ethylenedioxythiophene).

The material 114 promoting conduction of electrons may itself be chosen so that its conductivity $\sigma_2$ exceeds the electron conductivity $\sigma$ of material 103 of the active zone 102. The conductivity $\sigma_2$ of the material 114 promoting conduction of electrons may advantageously be such that $\sigma_2 \geq 2*\sigma$.

According to one possible embodiment, the material 114 promoting conduction of electrons may be an N type semiconducting material, for example such as diimide perylidene, or ambipolar such as N and P doped Si chosen such that the mobility $\mu_2$ of electrons in this material 114 is at least twice as high as the mobility of electrons in the material 103 in the remainder of the active zone.

The material 114 promoting conduction of electrons may for example be based on a metallic material such as Al, Cu, ITO (Indium Tin Oxide), or an N type semiconductor for example such as N doped Si.

The material 114 may also be based on a metal for example such as Au, that may be covered with an SAM (self assembled monolayer) layer designed to reduce the work function of the metal, and for example based on 4 MTP or 4-methylthiophenol.

According to another possible embodiment, the material 114 may also be based on an ambipolar material, for example such as N or P doped Si or be based on an electron acceptor polymer such as PSS poly(styrene sulfonate).

Figure 2B:
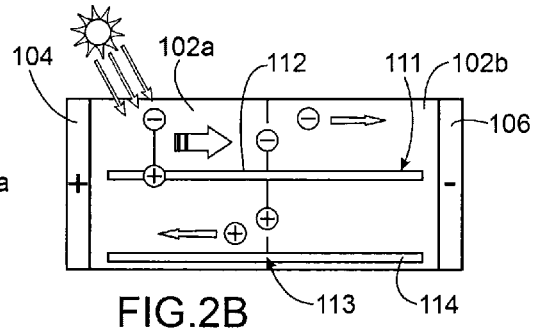

According to one variant shown in FIG. 2B, the polymer-based active zone 202 may be formed from a first region 202a based on an electron donor polymer, adjacent to a second region 202b based on an electron acceptor polymer.

When photons are absorbed by the active layer 202, excitons or electron-hole pairs are generated and then dissociated. The first element 111 promotes conduction of holes to the anode 104, while the second element 113 is promoting conduction of electrons to the cathode 106.

Figure 3:
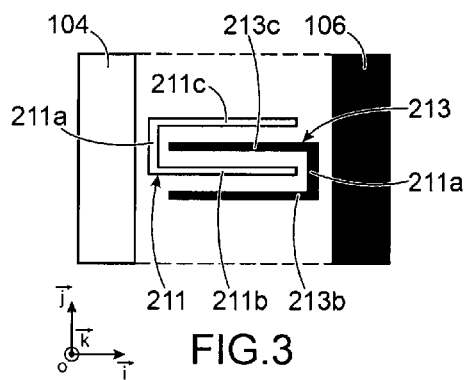
FIG. 3 shows a variant embodiment of a photodiode according to the invention, in which the elements promoting mobility of charge carriers are arranged in the active zone and are in the form of a 'U'.

FIG. 3 contains another example of an organic photodiode according to the invention.

In this example, a first element 211 in the form of a comb with two branches or a 'U' and based on a material 112 promoting conduction of holes is located in the active zone 102 between electrodes 104 and 106, while a U-shaped second element 213 based on a material 114 promoting conduction of electrons also passes through part of the active zone 102 between the electrodes 104 and 106.

The first element 211 comprises a zone 211a in the form of a track located close to the anode 104 and extending along the anode 104, and other tracks 221b, 211c extending along the cathode 104. The second element 213 comprises a zone 213a in the form of a track located close to the anode 104 extending along the cathode 106, and other tracks 213b, 213c extending towards the anode 106.

The arrangement of the first element 211 relative to the second element 213 may be such that a track 211b of the second element is located between the tracks 213b, 213c of the second element 213 that extend between the electrodes, a track 213a of the second element 213 being arranged between the tracks 211b, 211c of the first element 211 that extend between electrodes 104 and 106.

The active zone 102 thus comprises alternating tracks promoting conduction of holes and tracks promoting conduction of electrons.

Such an arrangement promotes transport of charge carriers while remaining small in size.

Figure 4:
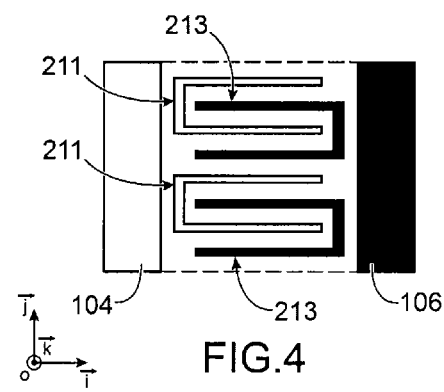
FIG. 4 shows another variant embodiment of the photodiode according to the invention, comprising an active zone with alternating elements promoting mobility of electrons and elements promoting mobility of holes.

The number of elements 211 and 213 in the volume of the active layer 102 can be increased in order to improve collection of charges. The active layer 102 of the polymer material on the photodiode shown in FIG. 4 has more elements 211, 213 than the device in FIG. 3, and in particular two U-shaped elements 211 promoting conduction of electrons and two other U-shaped elements promoting transport of holes.

Figure 5:
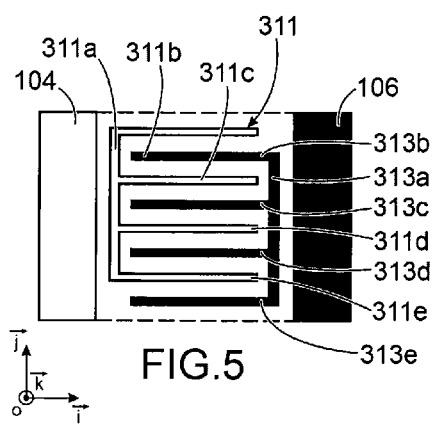
FIG. 5 shows another variant embodiment of the photodiode according to the invention, in which the active zone comprises elements promoting collection and transport of holes, and elements promoting collection and transport of electrons, in the form of interdigitated combs.

On the example in FIG. 5, the photodiode comprises a first element 311 promoting conduction of holes in the material of its active zone 102, formed from conducting tracks arranged in a first comb and a second element 313 promoting conduction of electrons and formed from conducting tracks formed in a second comb.

The first element 311 comprises an elongated track 311a arranged close to and parallel to the anode 104, and connected to the other tracks 311b, 311c, 311d, 311e extending in the direction of the cathode 106, orthogonal to the electrodes 104, 106.

The second element 313 comprises an elongated track 313a arranged close to and parallel to the cathode 106, and connected to other tracks 313b, 313c, 313d, 313e extending towards the anode 106 orthogonal to the electrodes 104, 106.

The first and the second combs are interdigitated such that the tracks 313b, 313c, 313d of the second element 313 are inserted as teeth between tracks of the first element 311.

Figure 6:
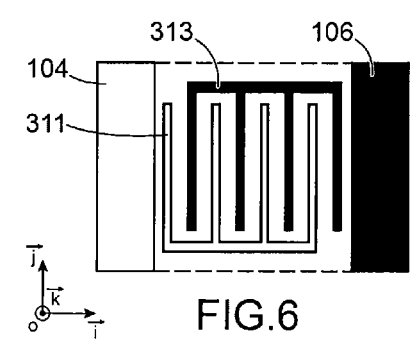
FIG. 6 shows a variant arrangement of the comb-shaped elements in FIG. 5.

FIG. 6 shows a variant arrangement that is different from the arrangement in FIG. 5 by the orientation of the elements 311 and 313 in the form of combs.

The first element 311 forming the first comb comprises a track forming a comb tooth extending close to and parallel to the anode 104, while the second element 313 forming the second comb comprises a track forming a comb tooth extending close to and parallel to the cathode 106.

Figure 7:
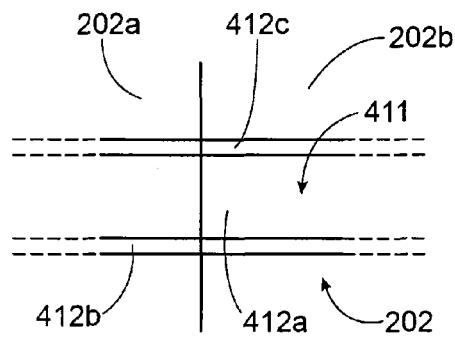
FIG. 7 shows a particular embodiment of elements passing through the active zone of a photodiode according to the invention designed to improve mobility of charge carriers in this photodiode.

FIG. 7 shows an another example of a microelectronic device according to the invention, comprising an active zone 202 of the same type as that in the device in FIG. 3, located between two electrodes (not shown) formed from a first region 202a based on an electron donor polymer adjacent to a second region 202b based on an electron acceptor polymer.

Elements 411 are provided in the active zone 202 to promote collection of charge carriers. These elements 411 pass through the first region 202a and the second region 202b and are formed from a metal area 412a covered in said first region 202a by a layer 412b capable of increasing the work function of said metal for the holes, the metal area 412a also being covered in said second region 202b by another layer 412c capable of reducing the work function of said metal.

The layers 412b, 412c may be SAM (self assembled monolayer) type layers, the layer 412b may for example be based on perfluorobenzenethiol, while the layer 412c may for example be based on 4-methylthiophenol formed on Au.

Figure 8:
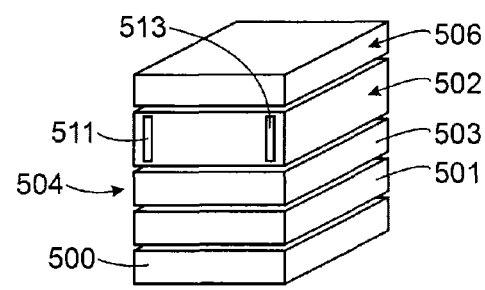
FIG. 8 shows an embodiment of an organic photodiode in the form of a stack of layers according to the invention.

FIG. 8 shows one example embodiment of a stack of layers of a photodiode according to the invention.

A first layer 501 for example based on ITO, is formed on a substrate 500 that may be rigid and may for example be made of glass, or flexible and for example based on polymer, and will form a transparent anode 502. Another layer 503 designed to improve injection in the anode, for example based on PEDOT-PSS and for example of the order of 50 nm thick is then formed on the first layer 501.

An active layer 502 is then formed that may for example be based on a mix of PZZ and PCBM in a solvent. The active layer 502 may be formed in several deposits, for example by ink jet or by spin coating, or deposited simply by doctor blading.

A first deposit of active material may be made on the layer 503. One or several conducting or semiconducting elements 511 promoting conduction of holes in the active material are formed. A second deposit of active material is then made and one or several conducting or semiconducting elements 513 are then made facilitating the conduction of electrons on the previously deposited layers of active material.

Another step is to make another deposit of active material to cover the elements 513.

A layer 506 is then formed to form a cathode. The layer 506 may for example be based on aluminium and may be of the order of 200 nm thick.

The device according to the invention may be used to recharge an external device, for example a capacitor or an accumulator.

Figure 9:
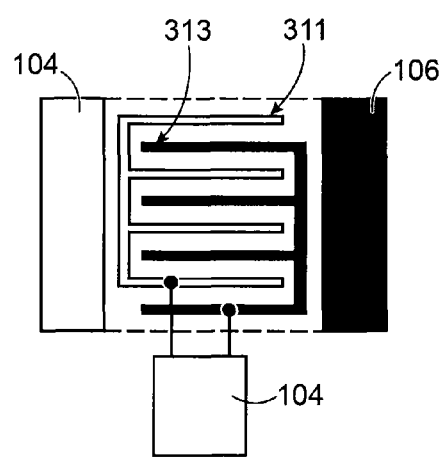
FIG. 9 shows a device in which a photodiode used according to the invention provided with conducting tracks arranged in the active zone and promoting transport of charges in this active zone, can inject a charge current into an external device connected to said conducting or semiconducting tracks.

The previously described structure on the example in FIG. 9 with reference to FIG. 5 is then used for example to recharge an accumulator.

A first element 311 promoting conduction of holes and formed from conducting tracks arranged in a first comb, is connected to a first electrode of means 400 forming a load, while a second element 313 promoting conduction of electrons and conducting tracks arranged in a second comb is connected to a second electrode of means 400. In this configuration, the electrodes 104 and 106 of the photodiode are left floating and are not connected to another device.

The photodiode is placed under an illumination provided so as to create charges that will circulate as far as the means 400. The means 400 may for example be in the form of at least one capacitor or at least one accumulator that is recharged by a current generated in the active zone and circulating in the elements 311, 313.

Figure 10:
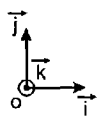
FIG. 10 shows another example photodiode according to the invention, with an active zone in which vertical elements are promoting collection and transport of holes and in which vertical elements are promoting collection and transport of electrons.
Figure 10:
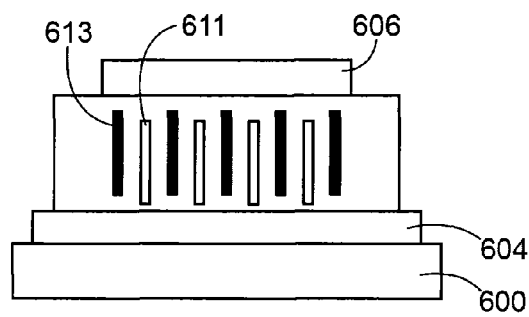

FIG. 10 shows another example photodiode according to the invention. This photodiode is formed on a substrate 600 covered by a cathode 604 above which there is an active zone 602 based on an inorganic semiconducting material, for example based on Ni oxide and Indium oxide, itself covered by an anode 606.

Elements 611 promoting conduction of holes and elements 613 promoting conduction of electrons are arranged in the active zone 602 along a vertical direction making a non-zero angle with the electrodes extending along a horizontal direction.

The invention claimed is:

1. A diode comprising:
   an active zone located between a first electrode and a second electrode, the active zone being formed from at least one semiconducting material, the active zone further comprising one or more conducting or semiconducting elements formed from elongated conducting zones that extend between the electrodes in the material of the active zone along a direction forming a non-zero angle with the electrodes, the elements not being connected to the electrodes and among the elements, one or more first elements is based on a first material promoting conduction of holes, and one or more second elements is based on a second material promoting conduction of electrons, the first material and the second material being based on a material different from the material in the active zone in which the first elements and the second elements are in contact, the first material having a hole conductivity higher than a hole conductivity of the material in the active zone, and the second material promoting conduction of electrons having a conductivity higher than an electron conductivity of the material in the active zone.

2. The diode according to claim 1, the active zone being formed from at least one semiconducting polymer material.

3. The diode according to claim 2, the elements being based on a material with better conductivity than the semiconducting material in the active zone.

4. The diode according to claim 1, wherein the elements are based on a material in which mobility of charge carriers is at least twice as high as mobility of charge carriers in the at least one semiconducting material in the active zone.

5. The diode according to claim 1, wherein at least one of the elements is based on a conducting polymer material.

6. The diode according to claim 1, wherein at least one of the elements is based on an ambipolar material.

7. The diode according to claim 1, wherein the elements include:
   at least one element based on a P type conducting material, chosen from among: Au, ITO, Cu, Ni, Ag, Pd, PDOT:PSS,
   at least one second element based on an N type conducting material, chosen from among: Ca, Al.

8. The diode according to claim 1, wherein at least one of the elements is based on a metal covered with a layer capable of modifying work function of the metal.

9. The diode according to claim 8, wherein the conducting or semiconducting elements further include:
   at least one first element based on a metal covered by a P type SAM layer based on PFBT or pentafluorobenzenethiol,
   or
   at least one first element based on a metal covered by an N type SAM layer based on 4MTP or methoxythiolphenol,
   or
   at least one or plural first element based on a metal covered by an N type SAM layer based on 4MTP or methoxythiolphenol and at least one first element based on a metal covered by a P type SAM layer based on PFBT or pentafluorobenzenethiol.

10. The diode according to claim 8, in which the active zone is formed from a first region based on the first polymer material and a second region adjacent to the first region and based on the second polymer material, at least one of the elements being based on a metal zone passing through the first region and the second region, the metal zone being covered in the first region by a layer capable of increasing output work of the metal, the metal zone being also covered in the second region with a layer capable of reducing the output work of the metal.

11. The diode according to claim 1, wherein the active zone is formed from a mix of a first polymer material and a second polymer material.

12. The diode according to claim 1, wherein the active zone is formed from a mix of PCBM and P3HT.

13. The diode according to claim 1, in which elements are formed from a set of tracks, an arrangement of the elements in the active zone forming an alternation of tracks promoting conduction of holes and of tracks promoting conduction of electrons.

14. The diode according to claim 13, wherein tracks promoting conduction of electrons and tracks promoting conduction of holes are arranged in a form of interdigitated combs.

15. The diode according to claim 14, wherein the first electrode acts as an anode and the second electrode acts as a cathode, elements promoting conduction of holes being arranged closer to the cathode than to the anode, elements promoting conduction of electrons being arranged closer to the anode than to the cathode.

16. The diode according to claim 15, wherein elements promoting conduction of holes are arranged at a distance d1 from the cathode at a distance $\Delta 1$ from the anode, and wherein $d1/\Delta 1 \leq 10$, elements promoting conduction of electrons being arranged at a distance not more than d2 from the anode and at least $\Delta 2$ from the cathode, in which $d2/\Delta 2 \leq 10$.

17. The diode according to claim 1, wherein the conducting or semiconducting elements have a total surface area that can be exposed to light radiation at least 10 times smaller than a surface area of the active zone exposed to the light radiation.

18. The diode according to claim 1, wherein the conducting or semiconducting elements have a thickness less than 100 nanometers.

19. A microelectronic device comprising at least one diode according to claim 1, the conducting elements being connected to a load in a form of an accumulator or a capacitor.

* * * * *